United States Patent
Lai et al.

(10) Patent No.: US 10,964,755 B2
(45) Date of Patent: Mar. 30, 2021

(54) ORGANIC LIGHT EMITTING DIODE PANEL INCLUDING LIGHT EMITTING UNITS AND COLOR FILTER LAYER, METHOD FOR MANUFACTURING THE SAME, AND DISPLAY DEVICE

(71) Applicants: BOE TECHNOLOGY GROUP CO., LTD., Beijing (CN); Ordos Yuansheng Optoelectronics Co., Ltd., Inner Mongolia (CN)

(72) Inventors: Weilin Lai, Beijing (CN); Xiaoyun Liu, Beijing (CN); Liang Chao, Beijing (CN)

(73) Assignees: BOE TECHNOLOGY GROUP CO., LTD., Beijing (CN); ORDOS YUANSHENG OPTOELECTRONICS CO., LTD., Ordos (CN)

( * ) Notice: Subject to any disclaimer, the term of this patent is extended or adjusted under 35 U.S.C. 154(b) by 0 days.

(21) Appl. No.: 16/058,923

(22) Filed: Aug. 8, 2018

(65) Prior Publication Data
US 2019/0157357 A1 May 23, 2019

(30) Foreign Application Priority Data
Nov. 17, 2017 (CN) .......................... 201711148166.8

(51) Int. Cl.
*H01L 27/32* (2006.01)
*H01L 51/56* (2006.01)
*H01L 51/52* (2006.01)

(52) U.S. Cl.
CPC ........ *H01L 27/3211* (2013.01); *H01L 27/322* (2013.01); *H01L 51/5253* (2013.01); *H01L 51/56* (2013.01); *H01L 27/3244* (2013.01)

(58) Field of Classification Search
CPC .......................... H01L 27/322; H01L 27/3211
See application file for complete search history.

(56) References Cited

U.S. PATENT DOCUMENTS

2016/0370655 A1* 12/2016 Nagayama .......... H01L 51/5281
2017/0213496 A1*  7/2017 Hsu ..................... H01L 27/3213

FOREIGN PATENT DOCUMENTS

CN    101847692 A    9/2010
CN    102916138 A    2/2013
(Continued)

OTHER PUBLICATIONS

Chinese Office Action dated Jan. 29, 2019, from application No. 201711148166.8.
(Continued)

*Primary Examiner* — Suberr L Chi
(74) *Attorney, Agent, or Firm* — Thomas|Horstemeyer, LLP

(57) ABSTRACT

The present disclosure relates to an organic light emitting diode panel and a method for manufacturing the same, and a display device. The organic light emitting diode panel includes a light emitting function layer disposed on a substrate, wherein the light emitting function layer includes a first light emitting unit, a second light emitting unit, and a third light emitting unit, the first light emitting unit, the second light emitting unit, and the third light emitting unit emit light of three colors, a light exit side of at least one of the light emitting units is provided with a color filter layer that filters out blue light from light emitted by the at least one of the light emitting units.

10 Claims, 6 Drawing Sheets

(56) References Cited

FOREIGN PATENT DOCUMENTS

| CN | 103840092 A | 6/2014 |
| CN | 104673284 A | 6/2015 |
| CN | 205645818 U | 10/2016 |
| CN | 106450025 A | 2/2017 |

OTHER PUBLICATIONS

Chinese Office Action dated Dec. 3, 2019, from application No. 201711148166.8.

* cited by examiner

ORGANIC LIGHT EMITTING DIODE PANEL INCLUDING LIGHT EMITTING UNITS AND COLOR FILTER LAYER, METHOD FOR MANUFACTURING THE SAME, AND DISPLAY DEVICE

CROSS-REFERENCE TO RELATED APPLICATIONS

This application claims priority to Chinese Patent Application 201711148166.8, filed Nov. 17, 2017, the entire contents of which are incorporated herein by reference.

TECHNICAL FIELD

The present disclosure relates to display technologies, and particularly to an organic light emitting diode panel, a method for manufacturing the organic light emitting diode panel, and an organic light emitting diode display device.

BACKGROUND

In the display technical field, liquid crystal display (LCD) devices and organic light emitting diode (OLED) display devices have gradually replaced CRT (Cathode Ray Tube) display devices. Consumers have increasingly high requirements for audio and video products. For flat panel display manufacturers, producing display devices of high-resolution and high-quality is the main development direction. OLED display devices are widely regarded as the most promising new generation display technology because of the advantages such as self-illumination, high brightness, wide viewing angle, fast response, color saturation, thinness, flexibility and low cost. At present, audio panels and mobile phones have used small and medium-sized OLED panels as display panels. In the future, the application range of OLED panels can be extended to large-scale display markets such as mobile products, notebook computers, monitors, wall-mounted TVs and the like, and the full-color technology is an indispensable key technology for OLED display devices.

At present, common full-color technologies for OLED display devices include Side-By-Side (SBS), Color OLED+ Color Filter (WCF) and Color Conversion Method (CCM).). Among them, the SBS method is currently the most mature OLED full-color display technology, with high luminous efficiency and high color saturation. The small and medium-sized OLED display devices that have been successfully commercialized are based on this technology.

However, OLED panels employing the SBS technology typically suffer from Red Shift problems. Therefore, how to solve the red shift problem of the existing OLED panels is a technical problem to be solved in the field.

SUMMARY

An arrangement of the present disclosure provides an organic light emitting diode panel, including a light emitting function layer disposed on a substrate. The light emitting function layer includes a first light emitting unit, a second light emitting unit, and a third light emitting unit, the first light emitting unit, the second light emitting unit, and the third light emitting unit emit light of three colors, a light exit side of at least one of the light emitting units is provided with a color filter layer that filters out blue light from light emitted by the at least one of the light emitting units.

According to an exemplary arrangement, the first light emitting unit is a red light emitting unit, the second light emitting unit is a green light emitting unit, and the third light emitting unit is a white light emitting unit.

The color filter layer includes a first blue color filter layer disposed on a light exit side of the white light emitting unit to filter out the blue light from all white light emitted by the white light emitting unit.

According to an exemplary arrangement, the first light emitting unit is a red light emitting unit, the second light emitting unit is a green light emitting unit, and the third light emitting unit is a white light emitting unit.

The color filter layer includes a first blue color filter layer and a second blue color filter layer, the first blue color filter is disposed on a light exit side of the white light emitting unit to filter out the blue light from all white light emitted by the white light emitting unit, and the second blue color filter layer is disposed on a light exit side of the green light emitting unit to filter out the blue light from a part of green light emitted by the green light emitting unit.

According to an exemplary arrangement, the first light emitting unit is a red light emitting unit, the second light emitting unit is a green light emitting unit, and the third light emitting unit is a blue light emitting unit.

The color filter layer includes a second blue color filter layer disposed on a light exit side of the green light emitting unit to filter out the blue light from a part of green light emitted by the green light emitting unit.

According to an exemplary arrangement, an area of the first blue color filter layer is greater than or equal to an area of the white light emitting unit, and an orthographic projection of the first blue color filter layer on the substrate includes an orthographic projection of the white light emitting unit on the substrate.

According to an exemplary arrangement, an area of the second blue color filter layer is smaller than an area of the green light emitting unit, and an orthographic projection of the second blue color filter layer on the substrate falls within an orthographic projection of the green light emitting unit on the substrate.

According to an exemplary arrangement, an area of the second blue color filter layer is 10% to 30% of an area of the green light emitting unit.

According to an exemplary arrangement, the OLED panel further includes an encapsulation structure. The encapsulation structure is a thin film encapsulation structure, each of the light emitting units includes an anode, a cathode and a light emitting layer between the anode and the cathode, and the color filter layer is disposed on a surface of the cathode away from the light emitting layer.

According to an exemplary arrangement, the OLED panel further includes an encapsulation structure. The encapsulation structure is a glass encapsulation structure, and the color filter layer is disposed on an encapsulation substrate or on a surface of the cathode away from the light emitting layer.

An arrangement of the present disclosure provides an organic light emitting diode display device, including the organic light emitting diode panel as described above.

In order to solve the above problem, an arrangement of the present disclosure provides a method for manufacturing an organic light emitting diode panel.

The method for manufacturing the organic light emitting diode panel includes forming a light emitting function layer on a substrate. The light emitting function layer includes a first light emitting unit, a second light emitting unit, and a third light emitting unit, and the first light emitting unit, the second light emitting unit, and the third light emitting unit emit light of three colors.

The method for manufacturing the organic light emitting diode panel further includes forming a color filter layer on a light exit side of at least one of the light emitting units to filter out blue light from light emitted by the at least one of the light emitting units.

According to an exemplary arrangement, the first light emitting unit is a red light emitting unit, the second light emitting unit is a green light emitting unit, and the third light emitting unit is a white light emitting unit.

The method for manufacturing an organic light emitting diode panel includes forming a color filter layer on a light exit side of at least one of the light emitting units to filter out blue light from light emitted by the at least one of the light emitting units, includes forming a first blue color filter layer on a light exit side of the white light emitting unit to filter out the blue light from all white light emitted by the white light emitting unit.

According to an exemplary arrangement, the first light emitting unit is a red light emitting unit, the second light emitting unit is a green light emitting unit, and the third light emitting unit is a white light emitting unit.

Forming a color filter layer on a light exit side of at least one of the light emitting units to filter out blue light from light emitted by the at least one of the light emitting units includes forming a first blue color filter layer on a light exit side of the white light emitting unit to filter out the blue light from all white light emitted by the white light emitting unit, and forming a second blue color filter layer on a light exit side of the green light emitting unit to filter out the blue light from a part of green light emitted by the green light emitting unit.

According to an exemplary arrangement, the first light emitting unit is a red light emitting unit, the second light emitting unit is a green light emitting unit, and the third light emitting unit is a blue light emitting unit.

Forming a color filter layer on a light exit side of at least one of the light emitting units to filter out blue light from light emitted by the at least one of the light emitting units, includes forming a second blue color filter layer on a light exit side of the green light emitting unit to filter out the blue light from a part of green light emitted by the green light emitting unit.

According to an exemplary arrangement, an area of the first blue color filter layer is greater than or equal to an area of the white light emitting unit, and an orthographic projection of the first blue color filter layer on the substrate includes an orthographic projection of the white light emitting unit on the substrate.

According to an exemplary arrangement, an area of the second blue color filter layer is smaller than an area of the green light emitting unit, and an orthographic projection of the second blue color filter layer on the substrate falls within an orthographic projection of the green light emitting unit on the substrate.

According to an exemplary arrangement, an area of the second blue color filter layer is 10% to 30% of an area of the green light emitting unit.

Implementing any of the products or methods of the present disclosure does not necessarily require all of the advantages described above to be achieved at the same time. Other features and advantages of the present disclosure will be set forth in the description regarding the exemplary arrangements of the present disclosure, and become apparent from the exemplary arrangements. The objectives and other advantages of the arrangements of the present disclosure can be realized and obtained by the structure particularly pointed out in the description, claims and drawings.

BRIEF DESCRIPTION OF THE DRAWINGS

The drawings are used to provide a further understanding of the technical solutions of the present disclosure, and constitute a part of the specification. The drawings together with the arrangements of the present disclosure are provided to explain the technical solutions of the present disclosure, and are not intended to limit the present disclosure. The shapes and sizes of the various components in the drawings do not reflect the true proportions, and are merely intended to illustrate the present disclosure.

LIST OF REFERENCE SIGNS

1—substrate;
2—driving structural layer;
3—light emitting function layer;
4—encapsulation structure;
5—color filter layer;
6—encapsulation substrate;
7—frame sealant;
33R—red light emitting unit;
33G—green light emitting unit;
33B—blue light emitting unit;
33W—white light emitting unit;
31—anode;
32—pixel define layer;
34—cathode;
41—thin film encapsulation layer;

51—first blue color filter layer;
52—second blue color filter layer.

DETAILED DESCRIPTION

The specific arrangements of the present disclosure are described in further detail below with reference to the accompanying drawings and examples. The following arrangements are intended to illustrate the present discourse but are not intended to limit the scope of the present discourse. It should be noted that the features in the arrangements and the arrangements in the present disclosure may be arbitrarily combined with each other, if the features or arrangements do not conflict with each other.

Existing OLED panels using the SBS technology include red (R), green (G), and blue (B) sub-pixels, which are arranged according to a standard RGB sub-pixel order. The red, green and blue sub-pixels are formed by evaporating organic light emitting materials using Fine Metal Mask (FMM). According to the research of the inventor of the present disclosure, in the existing SBS method, the RGB sub-pixels emit light separately to generate white light. The lifespans of the organic light emitting materials of the three colors are different, among which the lifespan of the blue organic light emitting material is the shortest. Thus, after a long period of use, the coordinates of the white light are red-shifted, and the display of the entire panel seem relatively pink. Since the lifespan of the blue material is the bottleneck of the current organic light emitting materials, it is difficult to effectively solve the red shift problem by means of materials in the near future.

Figure 1:
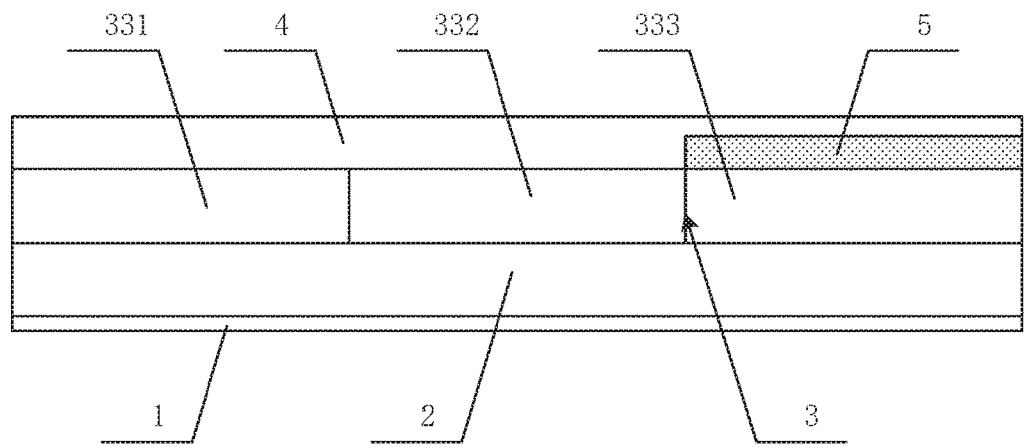
FIG. 1 is a schematic structural view of an OLED panel according to an arrangement of the present disclosure.

In order to solve the red shift problem of the existing OLED panel, an arrangement of the present disclosure provides an OLED panel and a method for manufacturing the same, and an OLED display device. The OLED panel includes a light emitting function layer disposed on a substrate. The light emitting function layer includes a first light emitting unit, a second light emitting unit, and a third light emitting unit, the first light emitting unit, the second light emitting unit, and the third light emitting unit emit light of three colors. A light exit side of at least one of the light emitting units is provided with a color filter layer that filters out blue light from light emitted by the at least one of the light emitting units. FIG. 1 is a schematic structural diagram of an OLED panel according to an arrangement of the present disclosure. As shown in FIG. 1, the main structure of the OLED panel includes a substrate 1, a driving structure layer 2 disposed on the substrate 1, a light emitting function layer 3 disposed on the driving structure layer 2, and an encapsulation structure 4. The light emitting function layer 3 includes a first light emitting unit 331, a second light emitting unit 332 and a third light emitting unit 333. The first light emitting unit 331, the second light emitting unit 332 and the third light emitting unit 333 are made of organic light emitting materials to emit light of three colors. A light exit side of at least one of the light emitting units is provided with a color filter layer 5 that filters out blue light from light emitted by the at least one of the light emitting units.

In one arrangement, the first light emitting unit is a red light emitting unit, the second light emitting unit is a green light emitting unit, and the third light emitting unit is a white light emitting unit. The color filter layer includes a first blue color filter layer disposed on a light exit side of the white light emitting unit to filter out the blue light from all white light emitted by the white light emitting unit.

In another arrangement, the first light emitting unit is a red light emitting unit, the second light emitting unit is a green light emitting unit, and the third light emitting unit is a white light emitting unit. The color filter layer includes a first blue color filter layer and a second blue color filter layer, the first blue color filter is disposed on a light exit side of the white light emitting unit to filter out the blue light from all white light emitted by the white light emitting unit, and the second blue color filter layer is disposed on a light exit side of the green light emitting unit to filter out the blue light from a part of green light emitted by the green light emitting unit.

In still another arrangement, the first light emitting unit is a red light emitting unit, the second light emitting unit is a green light emitting unit, and the third light emitting unit is a blue light emitting unit. The color filter layer includes a second blue color filter layer disposed on a light exit side of the green light emitting unit to filter out the blue light from a part of green light emitted by the green light emitting unit.

The arrangements of the present disclosure provide an OLED panel, which adopts an OLED+blue CF (color filter) structure, and uses a color filter layer to filter out blue light from the light emitted by the light emitting unit to maintain the light quantity and color saturation of the blue light. Thus, the present disclosure can adjust the white light coordinates of the OLED panel, and affectively address the problem of red shift of the existing OLED panel.

The technical solutions of the present disclosure will be described in detail with reference to specific arrangements.

First Arrangement

Figure 2:
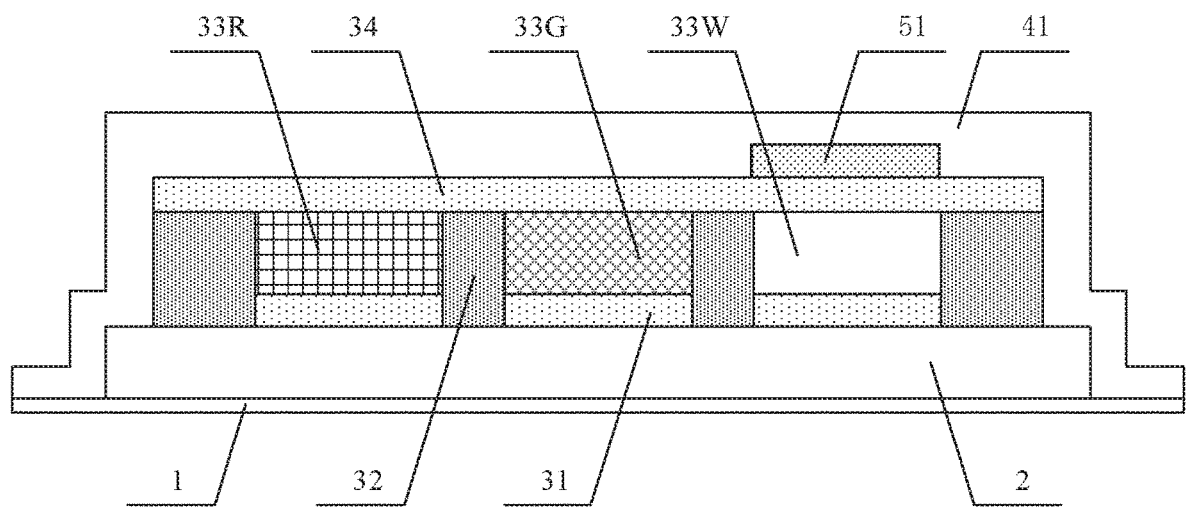
FIG. 2 is a schematic structural view of an OLED panel according to a first arrangement of the present disclosure.

FIG. 2 is a schematic structural view of an OLED panel according to a first arrangement of the present disclosure. As shown in FIG. 2, the main structure of the OLED panel of the arrangement includes a substrate 1, a driving structure layer 2 disposed on the substrate 1, a light emitting function layer 3 disposed on the driving structure layer 2, and a thin film encapsulation layer 41. The light emitting function layer 3 includes a red light emitting unit 33R, a green light emitting unit 33G, and a white light emitting unit 33W which re arranged regularly. The three light emitting units emit light by using organic light emitting materials. The light exit side (or light emitting side) of the white light emitting unit 33W is provided with a first blue color filter layer 51.

In this arrangement, the first blue color filter layer 51 is disposed on a surface of the light emitting function layer 3 facing the thin film encapsulation layer 41, that is, on the light exit side surface of the light emitting function layer 3. The first blue color filter layer has a filtering function, and only allows light in the blue band to pass through. Therefore, the white light emitted by the white light emitting unit 33W is filtered by the first blue color filter layer, and the blue light is filtered out and emitted outward. The blue light in conjunction with the red light emitted from the light emitting unit 33R and the green light emitted from the green light emitting unit 33G realizes full-color display. As compared with the prior art in which blue organic light emitting materials are used to emit blue light, the white OLED+blue CF structure is used as the blue light emitting unit for generating blue light. Since the white organic light emitting material and the color filter material have long service life, even after long-term use, the amount of blue light will not be reduced, and thus the color saturation of blue light can be maintained. Accordingly, the arrangement can effectively solve the problem of red shift of the OLED panel due to the short service life of the blue organic light emitting material.

In this arrangement, an area of the first blue color filter layer is greater than or equal to an area of the white light emitting unit, and an orthographic projection of the first blue color filter layer on the substrate includes (or covers) an orthographic projection of the white light emitting unit on the substrate. The term "orthographic projection" herein refers to the projection generated when projections lines are orthogonal to the projection plane. According to an exemplary arrangement, the area of the first blue color filter layer is the same as the area of the white light emitting unit, and the orthographic projection of the first blue color filter layer on the substrate completely overlaps the orthographic projection of the white light emitting unit on the substrate.

The technical solution of the arrangement is further described by the preparation process of the OLED panel of this arrangement.

Figure 3:
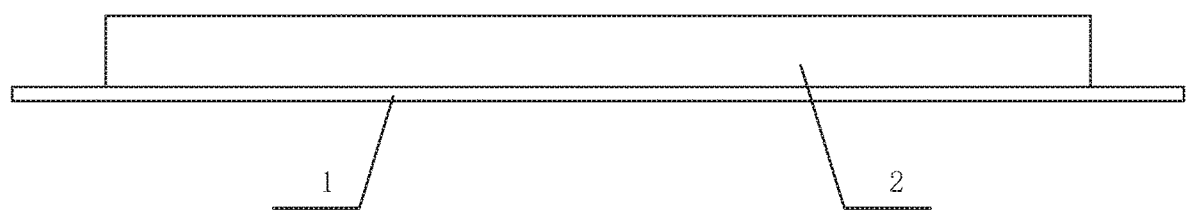
FIG. 3 is a schematic view after a pattern of a driving structure layer is formed according to the first arrangement of the present disclosure.

(1) First, a pattern of the driving structure layer 2 is prepared on the substrate 1, as shown in FIG. 3. The substrate may be formed by a material with high light transmittance, such as glass, quartz, polyolefin resin, polyethylene naphthalate resin, polyimide resin, polyphthalic plastic, or phenol resin. Alternatively, the substrate may be formed by a treated polymer film after surface treating, for example, a flexible material may be used as a substrate. The driving structure layer includes Thin Film Transistors (TFTs), and the structure and preparation process of the driving structure layer are the same as those in existing technologies. For example, the preparation process may be as follows. First, the substrate is cleaned. Then, a gate electrode, an insulating layer, an active layer, and source and drain electrodes are sequentially formed on the substrate by patterning processes. The TFTs may have a bottom gate structure or a top gate structure, and may be amorphous silicon (a-Si) TFTs or low temperature polysilicon (LTPS) TFTs or oxide (Oxide) TFTs. The present disclosure do not impose specific limitations on this.

Figure 4:
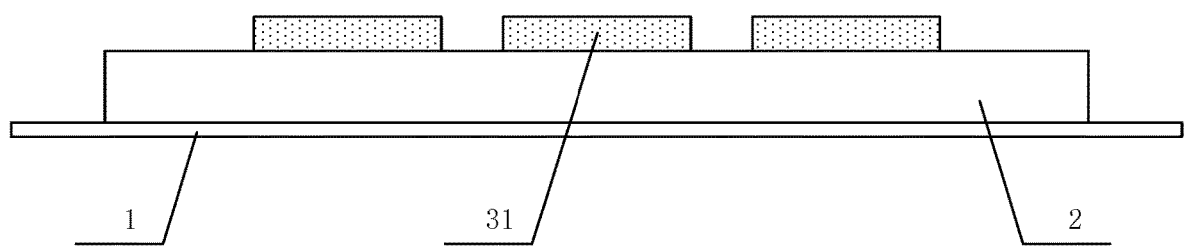
FIG. 4 is a schematic view after a pattern of an anode is formed according to the first arrangement of the present disclosure.

(2) A pattern of the anode 31 is formed on the substrate on which the aforementioned pattern is formed, as shown in FIG. 4. Since the OLED panel of the present arrangement has a top emission structure, the anode can be made of a metal having high reflectivity, such as silver (Ag), gold (Au), palladium (Pd), platinum (Pt), or the like, or an alloy of these metals, or a composite layer of these metals. In this arrangement, a composite layer structure of an indium tin oxide (ITO) layer and a metal reflective layer, such as an ITO layer/reflective layer/ITO layer, is used to form a reflective anode, which has good conductivity, high reflectivity, and good shape stability. Sex. Forming the anode having the composite layer structure includes sequentially depositing a first transparent conductive layer, a metal layer, and a second transparent conductive layer on the substrate on which the foregoing pattern is formed to form a pattern of the anode 31.

Figure 5:
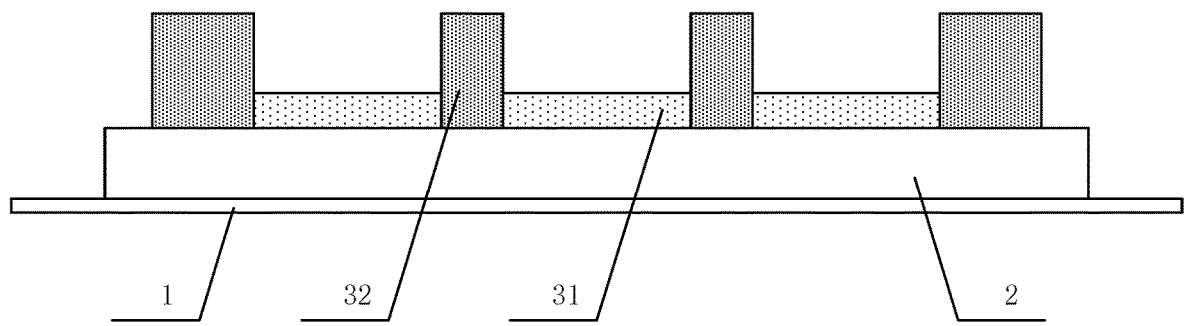
FIG. 5 is a schematic view after a pattern of a pixel define layer is formed according to the first arrangement of the present disclosure.

(3) A pattern of the pixel define layer 32 is formed on the substrate on which the aforementioned patterns are formed, as shown in FIG. 5. Forming the pattern of the pixel define layer 32 includes coating a pixel defining thin film on the substrate on which the foregoing patterns are formed, and performing exposure development on the pixel defining thin film by using a mask to form the pattern of the pixel define layer 32. The pixel define layer 32 defines a plurality of pixel regions exposing the light emitting regions. In this arrangement, the pixel define layer may be formed by polyimide, acrylic or polyethylene terephthalate, or may be formed by chemical vapor deposition. In actual implementation, the pixel define layer may be formed first, and then the anode is formed.

Figure 6:
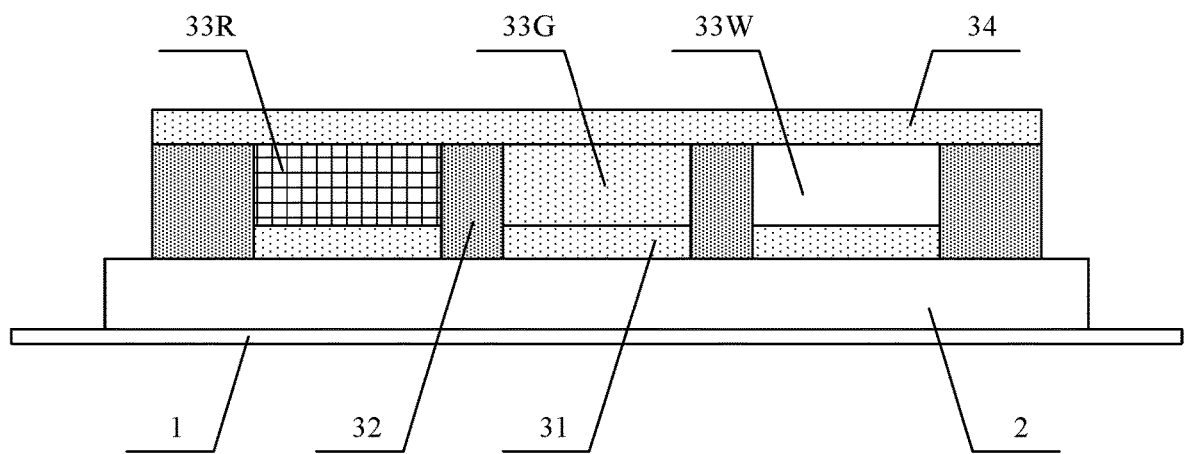
FIG. 6 is a schematic view after a pattern of an organic light emitting layer and a pattern of a cathode are formed according to the first arrangement of the present disclosure.

(4) Patterns of the organic light emitting layer and the cathode 34 are formed on the substrate on which the aforementioned patterns are formed, as shown in FIG. 6. Forming the patterns of the organic light emitting layer and the cathode includes sequentially depositing a red light emitting layer, a green light emitting layer, and a white light emitting layer by using a fine metal mask, and forming the red light emitting unit 33R, the green light emitting unit 33G, and the white light emitting unit 33W in the pixel regions, respectively; subsequently, forming a transparent conductive material by evaporation, and forming a transparent cathode 34 on the red light emitting unit 33R, the green light emitting unit 33G, and the white light emitting unit 33W. In practical implementation, the organic light emitting layer may include a hole injection layer (HIL), a hole transport layer (HTL), an electron blocking layer (EBL), an emission layer (EML), a hole blocking layer (HBL), and an electron transport layer. (ETL) and an electron injection layer (EIL), the light layers include a red electroluminescence material layer (REML), a green electroluminescence material layer (GEML), and a white electroluminescence material layer (WEML), and other structural forms may also be used, and the present disclosure does not impose specific limitations on this. As the transparent cathode, one of metal materials, such as magnesium (Mg), silver (Ag), aluminum (Al), copper (Cu), and lithium (Li), or an alloy of the above metals may be used.

Figure 7:
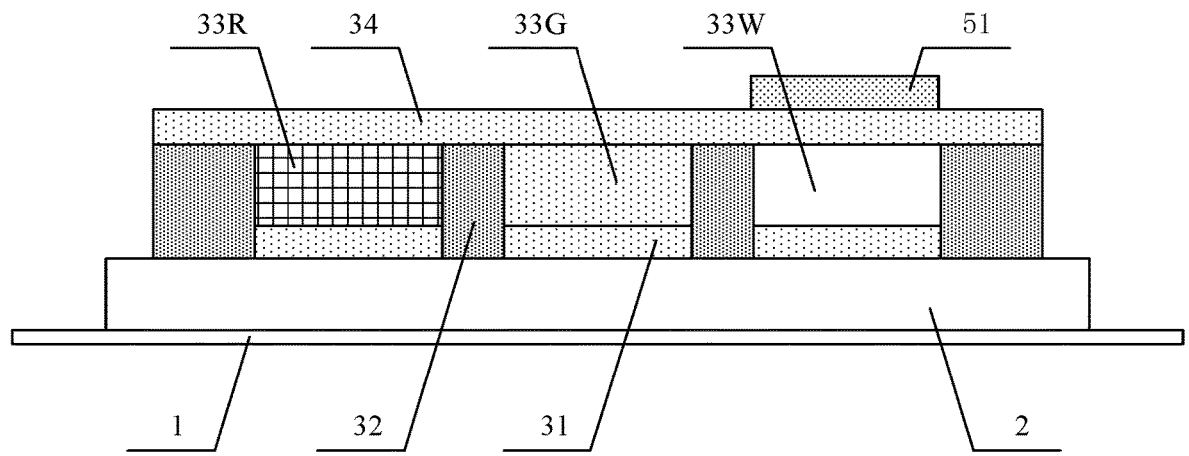
FIG. 7 is a schematic view after a pattern of a first blue color filter layer is formed according to the first arrangement of the present disclosure

(5) A pattern of the first blue color filter layer 51 is formed on the substrate on which the aforementioned patterns are formed, as shown in FIG. 7. Forming the pattern of the first blue color filter layer 51 includes depositing or coating a blue photoresist film on the substrate on which the above-mentioned patterns are formed, exposing and developing the blue photoresist film by using a mask, and forming the pattern of the first blue color filter layer 51 on the cathode 34. The position of the first blue color filter layer 51 corresponds to the position of the white light emitting unit 33W. That is, the first blue color filter layer 51 of the present arrangement is formed on the surface of the cathode 34 away from the light emitting layer, that is, away from the light exit side surface of the white light emitting unit 33W. The area of the first blue color filter layer 51 is greater than or equal to the area of the white light emitting unit 33W. According to an exemplary arrangement, the area of the first blue color filter layer 51 is the same as the area of the white light emitting unit 33W, and the orthographic projection of the first blue color filter layer 51 on the substrate completely coincides with the orthographic projection of the white light emitting unit 33W on the substrate.

(6) The thin film encapsulation layer 41 is formed on the substrate on which the aforementioned patterns are formed, as shown in FIG. 2. Forming the thin film encapsulation layer 41 includes depositing a film layer of an organic or inorganic composite material (such as tetrafluoroethylene, TFE) on the substrate on which the foregoing patterns are formed. The film layer covers the entire substrate to form a thin film encapsulation layer 41 for protecting the OLED panel. Alternatively, the encapsulation layer 41 is called as an encapsulation cover plate. Till now, the OLED panel structure of the arrangement is completed.

As can be seen from the above preparation processes, the present arrangement proposes a structure in which a white OLED+blue CF structure is used as a blue light emitting unit that generates blue light. The white organic light emitting material and the color film material have a long service life, and even after a long time use, the amount of the blue light will not be reduced, and thus the color saturation of the blue light can be maintained. Thus, the present arrangements can effectively solve the problem of red shift of the OLED panel due to the short service life of the blue organic light emitting material. In the existing structure, blue organic light emitting material is used to emit blue light. Since the blue organic light emitting material has the shortest service life, a red shift problem occurs after long-term use. In this arrangement, the color filter layer is used to filter out the blue light from all white light emitted by the white light emitting unit, rather than using the blue organic light emitting material with short service life. As a result, the amount of blue light and color saturation after long-term use are maintained, which effectively solves the problem of red shift of the existing OLED panel.

Figure 8:
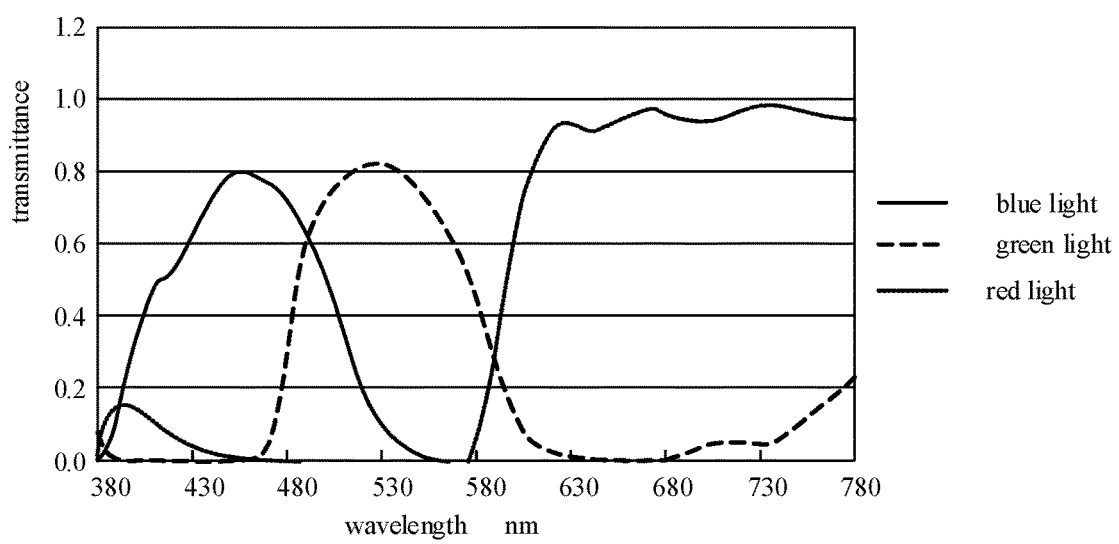
FIG. 8 is a light transmission spectrum diagram of RGB according to the first arrangement of the present disclosure.

FIG. 8 is a light transmission spectrum diagram of RGB of the first arrangement of the present disclosure. As shown in FIG. 8, since the blue color filter layer only allows light in the blue light band to pass through, the white light emitting unit in conjunction with the first blue color filter layer forms a blue light emitting unit that emits blue light. The blue light emitted by the white light emitting unit and the first blue color filter layer cooperates with the red light emitted by the red light emitting unit and the green light emitted by the green light emitting unit to finally realize full color display. In this arrangement, considering that the blue color saturation generated by the white OLED+blue CF structure may be slightly insufficient, the area of the white light emitting unit may be increased at the time of design, and the area of the white light emitting unit may be set to be larger than the area of the green light emitting unit, or larger than the area of the red light emitting unit. For example, the area of the red light emitting unit may be set as equal to the area of the green light emitting unit, and the area of the white light emitting unit may be set to be 105% to 130% of the area of the green light emitting unit, and the area of the first blue color filter layer is equal to the area of the white light emitting unit.

Second Arrangement

Figure 9:
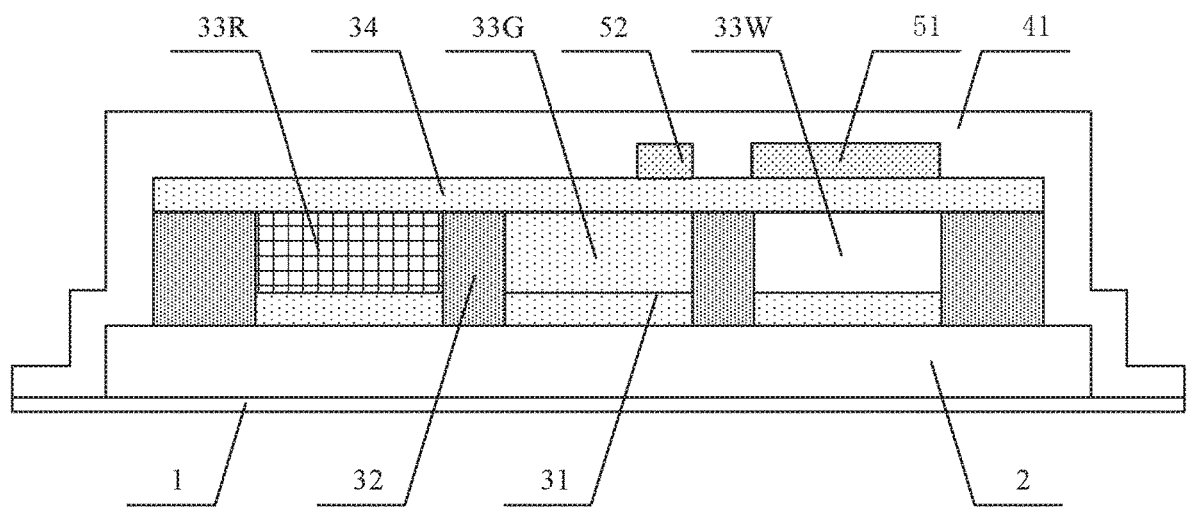
FIG. 9 is a schematic structural view of an OLED panel according to a second arrangement of the present disclosure.

FIG. 9 is a schematic structural view of an OLED panel according to a second arrangement of the present disclosure. As shown in FIG. 9, this arrangement is an extension of the foregoing first arrangement. The main structure of the OLED panel includes a substrate 1, a driving structure layer 2 disposed on the substrate 1, a light emitting function layer disposed on the driving structure layer 2, and a thin film encapsulation layer 41 covering the light emitting function layer 3. The light emitting function layer 3 includes a red light emitting unit 33R, a green light emitting unit 33G and a white light emitting unit 33W which are regularly disposed. The red light emitting unit 33R, the green light emitting unit 33G and the white light emitting unit 33W employ organic light emitting materials to emit light. A first blue color filter layer 51 is disposed on the light exit side of the white light emitting unit 33W. The first blue color filter layer 51 is the same as that in the first arrangement described above. A difference between the second arrangement and the first arrangement is that the second arrangement further includes a second blue color filter layer 52 disposed on the light exit side of the green light emitting unit 33G The area of the second blue color filter layer 52 is smaller than the area of the green light emitting unit 33G the position of the second blue color filter layer 52 corresponds to a partial area of the green light emitting unit 33G and an orthographic projection of the second blue color filter layer 52 on the substrate falls with the orthographic projection of the green light emitting unit 33G on the substrate. According to an exemplary arrangement, the area of the second blue color filter layer 52 is equal to 10% to 30% of the area of the green light emitting unit 33G and is disposed on a side of the green light emitting unit 33G adjacent to the white light emitting unit 33W. Further, the orthographic projection of the edge of the second blue color filter layer 52 adjacent to a side of the white light emitting unit 33W on the substrate completely coincides with the orthographic projection of the edge of the green light emitting unit 33G adjacent to the side of the white light emitting unit 33W on the substrate.

In the technical solution of the arrangement, through the combination structure of white OLED+blue CF and green OLED+blue CF, not only the red shift problem of the OLED panel due to the short service life of the blue organic light emitting material can be effectively solved, but also the amount of blue light cab be increased to maintain the color saturation of the OLED panel and adjust the white light coordinates of the OLED panel. In this arrangement, according to the principle that the green light spectrum contains a part of the blue light band, a second blue color filter layer having a relatively small area is disposed in a partial region of the green light emitting unit, and when the green light passes through the second blue color filter layer, a part of the blue light band in the green light spectrum can also passes through the second color filter layer to emit blue light, which increases the amount of blue light, so that the amount of blue light and blue color saturation are maintained after long-term use. Also, by adjusting the size of the second blue color filter layer, the white light coordinates of the OLED panel can be adjusted.

Figure 10:
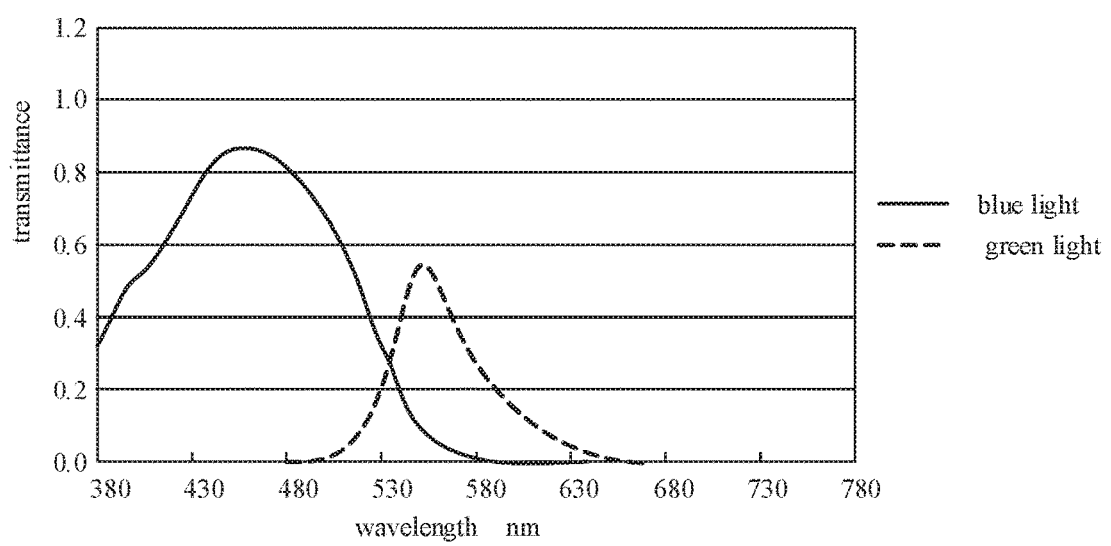
FIG. 10 is a light transmission spectrum diagram of blue light and green light according to the second arrangement of the present disclosure.

FIG. 10 is a light transmission spectrum diagram of blue light and green light according to a second arrangement of the present disclosure. As shown in FIG. 10, it can be seen by comparing FIG. 8 and FIG. 10 that, because of the second blue color filter layer having a relatively small area disposed on a part of the region of the green light emitting unit, the blue light band in the green light spectrum can pass through the second color filter layer to emit blue light, which increases the whole amount of blue light and thus is beneficial to maintain the light quantity and color saturation of the blue light, is beneficial to improve the overall color saturation of the OLED panel, and ensures the white light coordinates of the OLED panel.

The processes of preparing the OLED panel in this arrangement are substantially the same as that of the foregoing first arrangement, except that when the color filter layer pattern is formed, the first blue color filter layer and the second blue color filter layer are simultaneously formed, the position of the first blue color filter layer corresponds to the position of the white light emitting unit, and the position of the second blue color filter layer corresponds to the position of a part of the green light emitting unit, and repeated details are omitted here. In actual implementation, the first blue color filter layer and the second blue color filter layer may be independent patterns that are isolated from each other, or may be an integrated pattern that is connected together.

Third Arrangement

Figure 11:
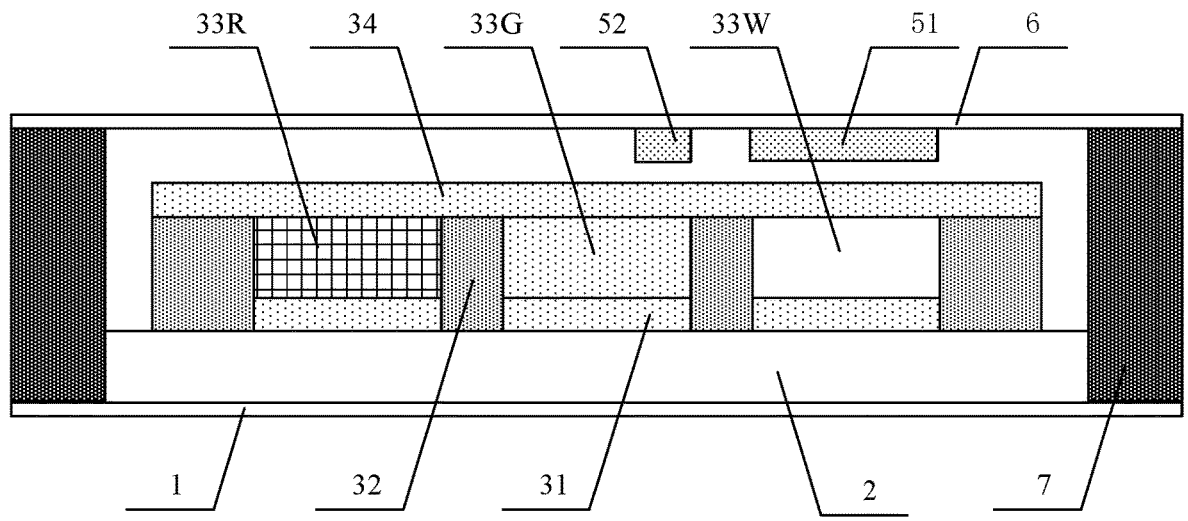
FIG. 11 is a schematic structural view of an OLED panel according to a third arrangement of the present disclosure.

FIG. 11 is a schematic structural view of an OLED panel according to a third arrangement of the present disclosure. As shown in FIG. 11, this arrangement is an extension of the foregoing first and second arrangements. The main structure of the OLED panel includes a substrate 1, a driving structure layer 2 disposed on the substrate 1, a light emitting function layer disposed on the driving structure layer 2, and an encapsulation structure. The light emitting function layer includes a red light emitting unit 33R, a green light emitting unit 33G and a white light emitting unit 33W which are disposed in order. The light exit side of the white light emitting unit 33W is provided with a first blue color filter layer 51, or the light exit side of the unit 33W is provided with the first blue color filter layer 51 and the light exit side of the green light emitting unit 33G is provided with a second blue color filter layer 52. A difference between the third arrangement and the above-described first and second arrangements is that the encapsulation structure in the first and second arrangements is implemented in a thin film encapsulation scheme, and the encapsulation structure in the third arrangement is implemented in a glass encapsulation scheme.

In this arrangement, the encapsulation structure using the glass encapsulation scheme includes an array substrate, an encapsulation (or package) substrate, and a frame sealant. The first blue color filter layer 51 and the second blue color filter layer 52 are disposed on a surface of the encapsulation substrate 6 toward a side of the array substrate, the encapsulation substrate 6 and the first blue color filter layer 51 and the second blue color filter layer 52 disposed on the package substrate 6 forms an encapsulation substrate. The substrate 1 and the driving structure layer 2 and the light emitting function layer disposed on the substrate 1 form an array substrate. The array substrate and the encapsulation substrate are packaged into an OLED panel by a frame sealant 7. This arrangement can also achieve the technical effects which cha be achieved by the foregoing first and second arrangements. According to an exemplary arrangement, the patterns of the first blue color filter layer and the second blue color filter layer may also be disposed on the light emitting function layer of the array substrate.

The processes of preparing the OLED panel in this arrangement are similar to that of the foregoing first and second arrangements, except that the array substrate and the encapsulation substrate are separately prepared in this arrangement. The processes of preparing the array substrate are the same as the preparation blocks (1) to (4) of the foregoing first arrangement, and details are not described herein again. The processes of preparing the encapsulation substrate include depositing or coating a blue photoresist film on the encapsulation substrate, exposing and developing the blue photoresist film by using a mask to form a pattern of the first blue color filter layer on the package substrate, or to form patterns of the first blue color filter layer and the second blue color filter layer on the substrate. The cell and encapsulation process include applying a sealant on the encapsulation substrate or the array substrate, and enabling the encapsulation substrate and the array substrate to be close to each other for alignment and pressing under vacuum conditions, and curing and hardening the frame sealant by ultraviolet curing and/or heat curing.

Fourth Arrangement

Figure 12:
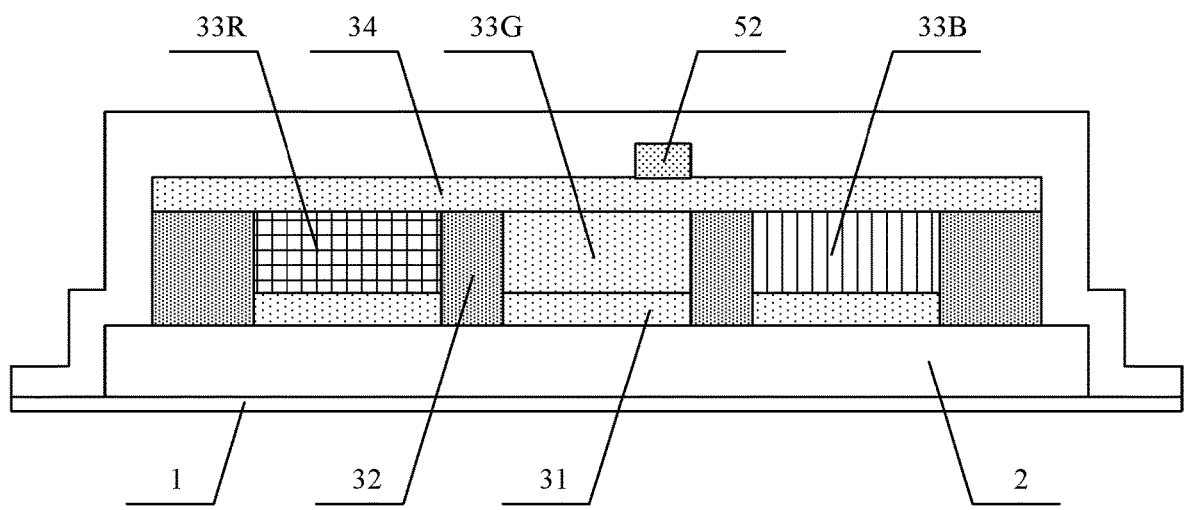
FIG. 12 is a schematic structural view of an OLED panel according to a fourth arrangement of the present disclosure.

Based on the technical ideas of the foregoing first, second and third arrangements, the present disclosure also provides a solution for delaying the occurrence of the red shift problem. FIG. 12 is a schematic structural view of an OLED panel according to a fourth arrangement of the present disclosure. As shown in FIG. 12, the main structure of the OLED panel of the present arrangement includes a substrate 1, a driving structure layer 2 disposed on the substrate 1, a light emitting function layer disposed on the driving structure layer 2, and an encapsulation structure. The light emitting function layer includes a red light emitting unit 33R, a green light emitting unit 33G, and a blue light emitting unit 33B arranged regularly. The red light emitting unit 33R, the green light emitting unit 33G, and the blue light emitting unit 33B emit light by using organic light emitting materials. A light exit side of the green emitting unit 33G is provided with a second blue color filter layer 52. The area of the second blue color filter layer 52 is smaller than the area of the green light emitting unit 33G, the position of the second blue color filter layer 52 corresponds to a partial area of the green light emitting unit 33G, and an orthographic projection of the second blue color filter layer 52 on the substrate falls within an orthographic projection of the green light emitting unit 33G on the substrate. According to an exemplary arrangement, the area of the second blue color filter layer 52 is equal to 10% to 30% of the area of the green light emitting unit 33G, and is disposed on a side of the green light emitting unit 33G adjacent to the white light emitting unit 33W. Further, the orthographic projection of the edge of the second blue color filter layer 52 adjacent to the side of the white light emitting unit 33W on the substrate completely coincides with the orthographic projection of the edge of the green light emitting unit 33G adjacent to the side of the white light emitting unit 33W on the substrate.

Aiming at the problem that red shift occurs in the OLED panel due to the short service life of the blue organic light emitting material existing in the prior art, this arrangement proposes a technical solution for delaying the occurrence of the red shift using the green OLED+blue CF structure. In this arrangement, based on the principle that the green light spectrum contains a part of the blue light band, a second blue color filter layer having a relatively small area is disposed in a part of the region of the green light emitting unit. When the green light passes through the second blue color filter layer, a part of the blue light band in the green light spectrum is transmitted, so that the amount and the color saturation of blue light can be maintained even after a long period of use. Generally, the efficiency and lifetime of the green organic light emitting material is much higher than that of the blue organic light emitting material, and thus even if the amount of blue light emitted by the blue organic light emitting material is reduced after long-term use, blue light can be filtered out from a part of the green light, thus making compensation to the reduction of the blue light emitted by the blue organic light emitting material. In this way, the whole amount of the blue light is not reduced, and thus the entire lifetime of the blue light is extended. The technical solution of the arrangement can not only maintain the amount and the color saturation of the blue light after long time use and delay the occurrence of the red shift, but also can adjust the white light coordinates of the OLED panel by adjusting the size of the second blue color filter layer.

In this arrangement, the encapsulation structure may be a thin film encapsulation structure or a glass encapsulation structure. The processes of preparing the OLED panel in this arrangement are similar to that of the previous arrangement, except that when the organic light emitting layer pattern is formed, the red organic light emitting material, the green organic light emitting material and the blue organic light emitting material are sequentially evaporated to form in the pixel regions the red light emitting unit 33R, the green light emitting unit 33G, and the blue sub-pixel 33B. Repeated descriptions are omitted here.

Fifth Arrangement

Figure 13:
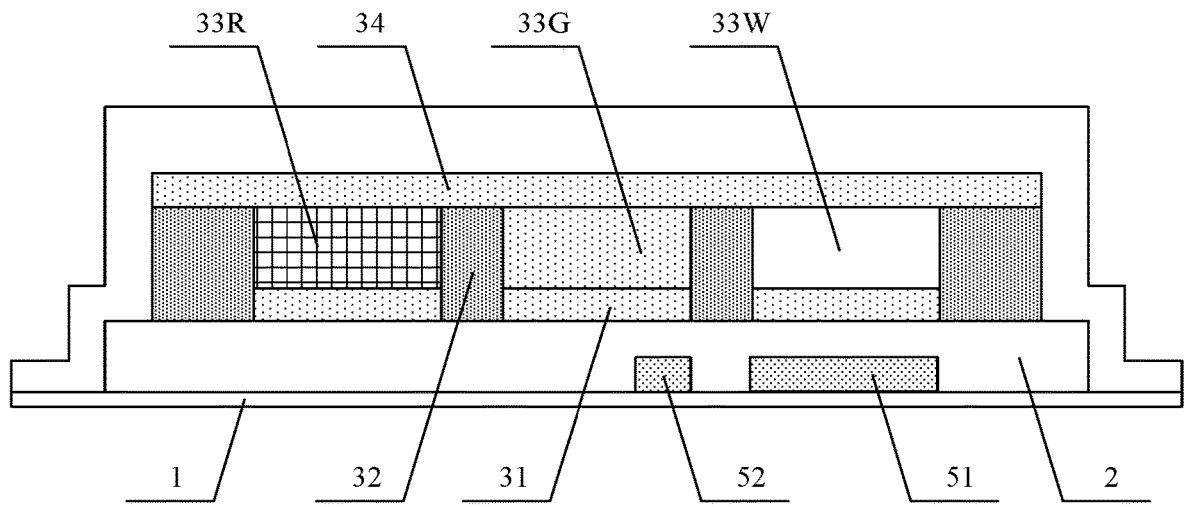
FIG. 13 is a schematic structural view of an OLED panel according to a fifth arrangement of the present disclosure.

In the foregoing first to third arrangements, descriptions regarding OLED panel having the top emission structure are provided. In fact, the technical solutions of the present disclosure can also be applicable to a bottom emission structure. FIG. 13 is a schematic structural view of an OLED panel according to a fifth arrangement of the present disclosure. As shown in FIG. 13, the main structure of the OLED panel of the present arrangement includes a substrate 1, a driving structure layer 2 disposed on the substrate 1, a light emitting function layer disposed on the driving structure layer 2, and an encapsulation structure. The light emitting function layer includes a red light emitting unit 33R, a green light emitting unit 33G, and a white light emitting unit 33W which are sequentially disposed. The red light emitting unit 33R, the green light emitting unit 33G, and the white light emitting unit 33W emit light by using organic light emitting materials. A light exit side of the white light emitting unit 33W is provided with a first blue color filter layer 51, or the light exit side of the white light emitting unit 33W is provided with the first blue color filter layer 51 and a light exit side of the green light emitting unit 33G is provided with a second blue color filter layer 52. The first blue color filter layer 51 and the second blue color filter layer 52 are disposed on the surface of the substrate 1 facing the light emitting function layer 3, or on the surface of the driving structure layer 2 facing the light emitting function layer 3, or disposed inside the driving structural layer 2. Since the OLED panel of the arrangement is a bottom emission structure, the cathode can be made of a metal having high reflectivity, or a metal alloy, or a metal composite layer, such as ITO layer/reflective layer/ITO layer, and the anode is made of a transparent material. Other structures and preparation processes are the same as that of the foregoing first to third arrangements, and details are not described herein again.

Also, the aforementioned fourth arrangement for the top emission structure is also applicable to the bottom emission structure. The light emitting function layer includes a red light emitting unit, a green light emitting unit, and a blue sub-pixel that are regularly arranged and emit light by using organic light emitting materials. A light exit side of the green light emitting unit is provided with a second blue color filter layer. The second blue color filter layer is disposed on the surface of the substrate facing the light emitting function layer, or on the surface of the driving structure layer facing the light emitting function layer, or disposed inside the driving structure layer. Obviously, the present arrangement can be extended to a double-side emission structure by combining the present arrangement with the foregoing first to fourth arrangements.

Sixth Arrangement

Figure 14:
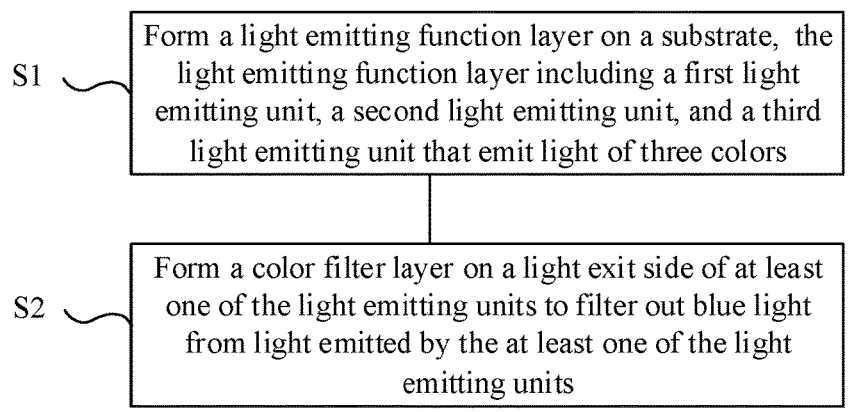
FIG. 14 is a flow chart of a method for manufacturing an OLED panel according to an arrangement of the present disclosure.

Based on the technical ideas of the foregoing arrangements, an arrangement of the present disclosure further provides a method for manufacturing an OLED panel. FIG. 14 is a flow chart of a method for manufacturing an OLED panel according to an arrangement of the present disclosure. As shown in FIG. 14, the method for manufacturing an OLED panel includes the following blocks.

In S1, a light emitting function layer is formed on the substrate. The light emitting function layer includes a first light emitting unit, a second light emitting unit, and a third light emitting unit. The first light emitting unit, the second light emitting unit, and the third light emitting unit emit light of three colors.

In S2, a color filter layer is formed on a light exit side of at least one of the light emitting units. The color filter layer filters out blue light from the light emitted by the at least one of light emitting units.

In one arrangement, the first light emitting unit is a red light emitting unit, the second light emitting unit is a green light emitting unit, and the third light emitting unit is a white light emitting unit. S2 includes forming a first blue color filter layer on a light exit side of the white light emitting unit to filter out the blue light from all white light emitted by the white light emitting unit.

In another arrangement, the first light emitting unit is a red light emitting unit, the second light emitting unit is a green light emitting unit, and the third light emitting unit is a white light emitting unit. S2 includes forming a first blue color filter layer on a light exit side of the white light emitting unit to filter out the blue light from all white light emitted by the white light emitting unit, and forming a second blue color filter layer on a light exit side of the green light emitting unit to filter out the blue light from a part of green light emitted by the green light emitting unit.

In still another arrangement, the first light emitting unit is a red light emitting unit, the second light emitting unit is a green light emitting unit, and the third light emitting unit is a blue light emitting unit. S2 includes forming a second blue color filter layer on a light exit side of the green light emitting unit to filter out the blue light from a part of green light emitted by the green light emitting unit.

According to an exemplary arrangement, the area of the first blue color filter layer is greater than or equal to the area of the white light emitting unit, and an orthographic projection of the first blue color filter layer on the substrate includes an orthographic projection of the white light emitting unit on the substrate. The area of the second blue color filter layer is smaller than the area of the green light emitting unit, and an orthographic projection of the second blue color filter layer on the substrate is located within an orthographic projection of the green light emitting unit on the substrate. The area of the second blue color filter layer is 10% to 30% of the area of the green light emitting unit.

In addition, the method for fabricating an OLED panel further forming an encapsulation structure, which may be a thin film encapsulation structurer or a glass encapsulation structure. When the thin film encapsulation is adopted, the first blue color filter layer is formed on the light emitting surface of the cathode in the white light emitting unit, and the second blue color filter layer is formed on the light emitting surface of the cathode in the green light emitting unit. When the glass encapsulation is used, the first blue color filter layer is formed on a surface of the encapsulation substrate facing a side of the white light emitting unit, the position of the first blue color filter layer corresponds to the entire area where the white light emitting unit is located; the second blue color filter layer is formed on a surface of the encapsulation substrate toward the green light emitting unit, and the position of the green light emitting unit corresponds to a part of the region where the green light emitting unit is located.

Seventh Arrangement

An arrangement of the present disclosure further provides an OLED display device, including the OLED panel as described in the foregoing arrangements. The OLED display device can be any product or component having a display function, such as a mobile phone, a tablet computer, a television, a display, a notebook computer, a digital photo frame, a navigator, and the like.

In the description of the arrangements of the present disclosure, it is to be understood that the terms "middle", "upper", "lower", "front", "back", "vertical", "horizontal", "top", "bottom", "inside", "outside" and the like indicate the orientation or positional relationship based on the orientation or positional relationship shown in the drawings. Such terms are used merely for the convenience of the description of the present disclosure, rather than indicating or implying that the devices or components described herein need to have a particular orientation, or need to be manufactured in a particular orientation or operation, and the descriptions using the above terms should not be construed as limiting the present disclosure.

In the description of the arrangements of the present disclosure, the terms "installation", "connected", and "coupled" should be understood broadly, and may be, for example, a fixed connection or a removable or detachable connection, or an integral connection; may be a mechanical connection or electrical connection; may be a direct connection, or may be an indirect connection through an intermediate medium, or may be internal communication between the two elements. The specific meaning of the above terms in the present disclosure can be understood by those skilled in the art depending on specific contexts.

While the arrangements of the present disclosure have been described above, the described arrangements are merely for the purpose of understanding the present disclosure and are not intended to limit the present disclosure. Any modifications and variations in the form and details of the arrangements may be made by those skilled in the art without departing from the spirit and scope of the present disclosure. The scope of the present disclosure is defined by appended claims.

What is claimed is:

1. An organic light emitting diode panel, comprising:
a light emitting function layer disposed on a substrate, wherein the light emitting function layer comprises a first light emitting unit, a second light emitting unit, and a third light emitting unit, the first light emitting unit, the second light emitting unit, and the third light emitting unit emit light of three colors, a light exit side of at least one of the first light emitting unit, the second light emitting unit, and the third light emitting unit emits light and is provided with a color filter layer that filters out blue light from light emitted by the at least one of the second light emitting unit and the third light emitting unit, wherein
the first light emitting unit is a red light emitting unit, the second light emitting unit is a green light emitting unit, and the third light emitting unit is a white light emitting unit; and
the color filter layer comprises a first blue color filter layer and a second blue color filter layer, the first blue color filter layer is disposed on a light exit side of the white light emitting unit to filter out blue light from all white light emitted by the white light emitting unit, and the second blue color filter layer is disposed on a light exit side of the green light emitting unit to filter out blue light from a part of green light emitted by the green light emitting unit.

2. The organic light emitting diode panel according to claim 1, wherein an area of the first blue color filter layer is greater than or equal to an area of the white light emitting unit, and an orthographic projection of the first blue color filter layer on the substrate comprises an orthographic projection of the white light emitting unit on the substrate.

3. The organic light emitting diode panel according to claim 1, wherein an area of the second blue color filter layer is smaller than an area of the green light emitting unit, and an orthographic projection of the second blue color filter layer on the substrate falls within an orthographic projection of the green light emitting unit on the substrate.

4. The organic light emitting diode panel according to claim 3, wherein an area of the second blue color filter layer is 10% to 30% of an area of the green light emitting unit.

5. The organic light emitting diode panel according to claim 1, wherein an area of the second blue color filter layer is smaller than an area of the green light emitting unit, and an orthographic projection of the second blue color filter layer on the substrate falls within an orthographic projection of the green light emitting unit on the substrate.

6. The organic light emitting diode panel according to claim 1, further comprising an encapsulation structure;
wherein the encapsulation structure is a thin film encapsulation structure, each of the first light emitting unit, the second light emitting unit, and the third light emitting unit includes an anode, a cathode and a light emitting layer between the anode and the cathode, and the color filter layer is disposed on a surface of the cathode away from the light emitting layer; or
the encapsulation structure is a glass encapsulation structure, and the color filter layer is disposed on an encapsulation substrate or on a surface of the cathode away from the light emitting layer.

7. An organic light emitting diode display device, comprising:
an organic light emitting diode panel, wherein the organic light emitting diode panel comprises a light emitting function layer disposed on a substrate, the light emitting function layer comprises a first light emitting unit, a second light emitting unit, and a third light emitting unit, the first light emitting unit, the second light emitting unit, and the third light emitting unit emit light of three colors, a light exit side of at least one of the first light emitting unit, the second light emitting unit, and the third light emitting unit is provided with a color filter layer that filters out blue light from light emitted by the at least one of the second light emitting unit and the third light emitting unit, wherein
the first light emitting unit is a red light emitting unit, the second light emitting unit is a green light emitting unit, and the third light emitting unit is a white light emitting unit; and
the color filter layer comprises a first blue color filter layer and a second blue color filter layer, the first blue color filter layer is disposed on a light exit side of the white light emitting unit to filter out blue light from all white light emitted by the white light emitting unit, and the second blue color filter layer is disposed on a light exit side of the green light emitting unit to filter out blue light from a part of green light emitted by the green light emitting unit.

8. A method for manufacturing an organic light emitting diode panel, comprising:
forming a light emitting function layer on a substrate, wherein the light emitting function layer comprises a first light emitting unit, a second light emitting unit, and a third light emitting unit, and the first light emitting unit, the second light emitting unit, and the third light emitting unit emit light of three colors; and
forming a color filter layer on a light exit side of at least one of the first light emitting unit, the second light emitting unit, and the third light emitting unit to filter out blue light from light emitted by the at least one of the second light emitting unit and the third light emitting unit, wherein
the first light emitting unit is a red light emitting unit, the second light emitting unit is a green light emitting unit, and the third light emitting unit is a white light emitting unit; and
the color filter layer comprises a first blue color filter layer and a second blue color filter layer, the first blue color filter layer is disposed on a light exit side of the white light emitting unit to filter out blue light from all white light emitted by the white light emitting unit, and the second blue color filter layer is disposed on a light exit side of the green light emitting unit to filter out blue light from a part of green light emitted by the green light emitting unit.

9. The method according to claim 8, wherein an area of the first blue color filter layer is greater than or equal to an area of the white light emitting unit, and an orthographic projection of the first blue color filter layer on the substrate comprises an orthographic projection of the white light emitting unit on the substrate;

an area of the second blue color filter layer is smaller than an area of the green light emitting unit, and an orthographic projection of the second blue color filter layer on the substrate falls within an orthographic projection of the green light emitting unit on the substrate.

10. The method according to claim 9, wherein an area of the second blue color filter layer is 10% to 30% of an area of the green light emitting unit.

* * * * *